United States Patent
Wells

(10) Patent No.: US 7,712,003 B2
(45) Date of Patent: May 4, 2010

(54) METHODOLOGY AND SYSTEM TO SET JTAG INTERFACE

(75) Inventor: Richard J. Wells, Garner, NC (US)

(73) Assignee: International Business Machines Corporation, Armonk, NY (US)

( * ) Notice: Subject to any disclaimer, the term of this patent is extended or adjusted under 35 U.S.C. 154(b) by 429 days.

(21) Appl. No.: 11/838,972

(22) Filed: Aug. 15, 2007

(65) Prior Publication Data
US 2009/0045795 A1 Feb. 19, 2009

(51) Int. Cl.
*G01R 31/28* (2006.01)
(52) U.S. Cl. .......................... 714/727; 714/22; 713/300
(58) Field of Classification Search ................. 455/574; 713/322, 300; 727/538; 714/727, 22
See application file for complete search history.

(56) References Cited

U.S. PATENT DOCUMENTS

| | | | |
|---|---|---|---|
| 6,275,077 B1 | 8/2001 | Tobin et al. | |
| 6,484,041 B1 * | 11/2002 | Aho et al. | 455/574 |
| 6,769,069 B1 | 7/2004 | Nguyen | |
| 6,865,705 B2 | 3/2005 | Tomizawa et al. | |
| 7,039,839 B2 | 5/2006 | Gass | |
| 7,080,267 B2 * | 7/2006 | Gary et al. | 713/300 |
| 7,305,569 B2 * | 12/2007 | Reilly | 713/300 |
| 7,337,335 B2 * | 2/2008 | Jorgenson et al. | 713/300 |
| 7,495,502 B2 * | 2/2009 | Weder et al. | 327/538 |
| 7,596,708 B1 * | 9/2009 | Halepete et al. | 713/322 |
| 2002/0104031 A1 | 8/2002 | Tomlinson et al. | |

* cited by examiner

*Primary Examiner*—David Ton
(74) *Attorney, Agent, or Firm*—Joscelyn G. Cockburn; Mark E. McBurney

(57) ABSTRACT

A method and apparatus determines and sets operating voltage on a JTAG interface by incrementally increasing a test voltage applied thereto. The contents of a register is monitored to detect when the contents switch (change) from a first value to a second value. The voltage occurring at the switch is doubled to establish the operating voltage.

25 Claims, 4 Drawing Sheets

METHODOLOGY AND SYSTEM TO SET JTAG INTERFACE

BACKGROUND OF THE INVENTION

1. Field of the Invention

The present invention relates to testing electronic circuits in general, and in particular to testing electronic circuit based upon JTAG standard specified by IEEE 1149.1 specification.

2. Related Art

The use of the IEEE 1149.1 JTAG interface to communicate with a processor under test on a circuit board is well known in the prior art. There is a wide range of operating voltages for the target microprocessor and the circuit boards. As a consequence, the JTAG interface must be able to adjust its operating voltage to be compatible with the target system. If the operating voltage is set incorrectly this could result in damage to the system (microprocessor and circuit) under test.

One obvious solution would be to set the operating voltage manually. This is usually done with the user issuing a command to the probe to set the operating voltage to a level compatible with the target. This solution introduces the possibility that the user may specify the wrong value to the test software which results in the wrong voltage level being used thereby causing physical damage to the processor and other circuit components. To minimize this human error a more efficient method and apparatus are required for setting the JTAG interface between the probe and unit under test.

SUMMARY OF THE INVENTION

The present invention automatically determines and set the operating voltage on the JTAG interface. The system and method of the present invention includes a software program executed on a computer. The program issues commands to a JTAG probe which incrementally adjust the voltage that is applied to the JTAG interface. The program also monitors the state of a register on the evaluation board to determine when the contents of the register switch from a first value to a second value. The value of the voltage at the time the contents of the register switches is stored and is used as is, as the operating voltage for the JTAG interface or alternately, the voltage saved is modified to provide the operating voltage. With the disclosed method and apparatus the likelihood of human error is eliminated.

BRIEF DESCRIPTION OF THE DRAWINGS

The novel features believed characteristic of the invention are set forth in the appended claims. The invention itself, however, as well as a preferred mode of use further objectives and advantages there will best be understood by reference to the following detailed description of an illustrated embodiment when read in conjunction with the accompanying drawings wherein:

DESCRIPTION OF AN EMBODIMENT OF THE PRESENT INVENTION

Figure 1A:
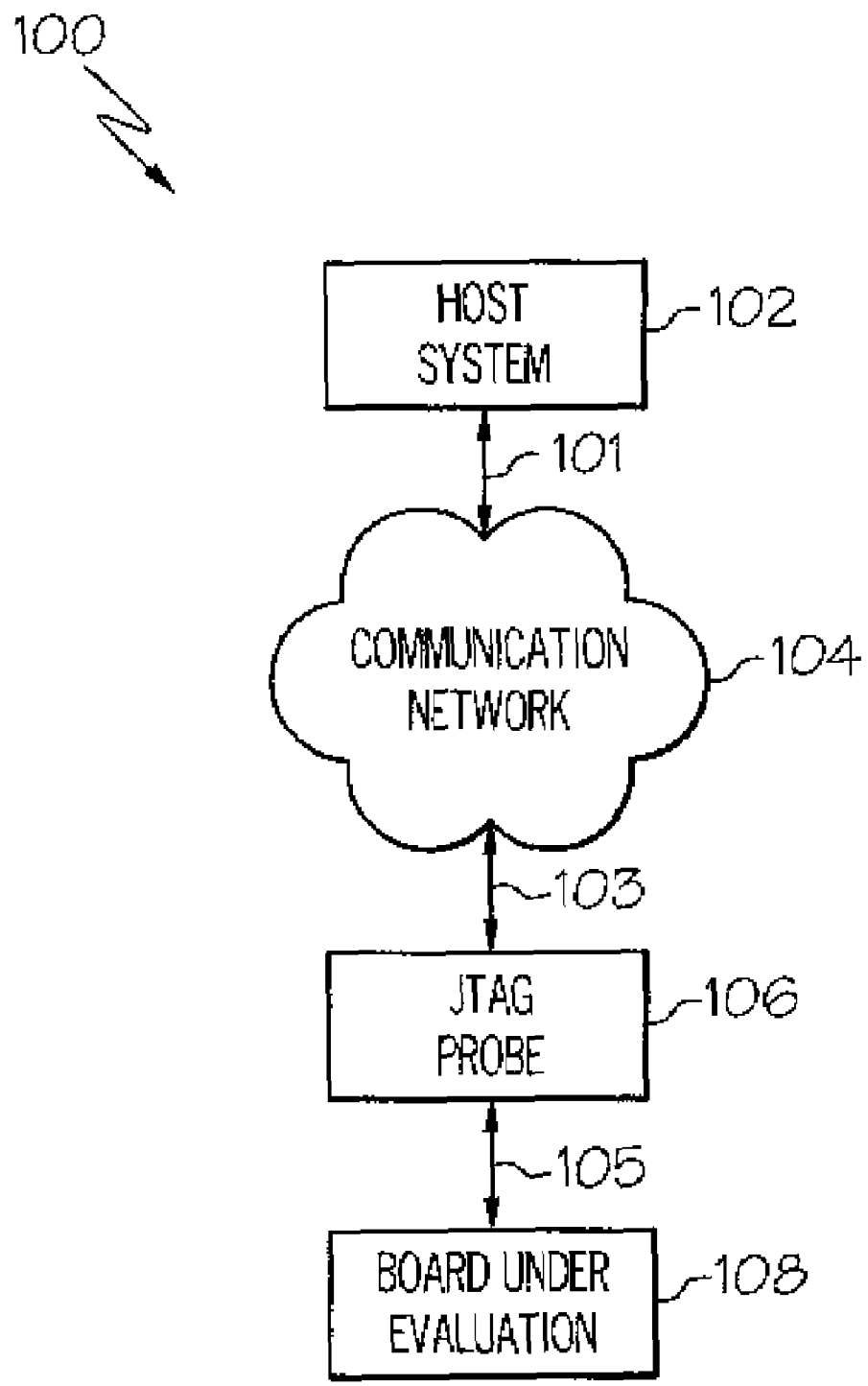
FIG. 1A illustrates a test bed embodying the teachings of the present invention.

FIG. 1 shows test bed 100 which includes teachings of the present invention. The test bed 100 includes a host system 102, communications network 104 JTAG probe 106 and the board under evaluation 108.

The host system 102 can be any type of computer including a PC such as ThinkPad® manufacture and market by IBM® and others. As describe herein the host system executes the computer program that sets the operating voltage on the JTAG interface according to teachings of the present invention. The host system 102 is connected to communication network 104 by transmission media 101. The communication network 104 can be a local area network (L A N) such as ethernet, world wide web also known as internet or any other type of interconnection network. The JTAG probe 106 is connected by transmission medium, such as a cable, 103 to the communications network 104. The JTAG probe 106 is an off shelf device whose design is in part promulgated by IEEE 1149.1 JTAG specification. The probe and specification are well known in the testing technology. Therefore, detailed discussion of these items will not be given here. Suffice it to say the JTAG probe allows remote testing of electronic circuits, such as a processor, mounted on a board with specified JTAG logic, on the board, cooperating with the JTAG probe to effectuate testing of the processor. The JTAG probe has an interface that handles communications received from the host system over the communications network. The probe also has a section that manages communications between the probe and the JTAG component on the board under evaluation 108. The interface between the JTAG component on the evaluation board and the probe is referred to as the JTAG interface. The JTAG probe has the internal electronics to generate a plurality of different voltage levels and apply an appropriate one to the JTAG interface. However, the JTAG probe must be told which one of the plurality of voltage must be selected and use on the JTAG interface. The selected voltage must be compatible with the processor under test, else selecting the wrong voltage could result in damage to the processor. The present invention, describe herein, automatically determines the appropriate voltage at which the JTAG interface is to operate, without damage to the evaluation board and instruct the probe to set the interface at the selected voltage.

Still referring to FIG. 1 the JTAG probe receives messages from the host system 102 over communications network 104. The messages are formatted with a communication protocol, such as ethernet. The messages are processed, converted to JTAG protocol and is transmitted over conductor 105 to the JTAG component on the board under evaluation 108. Turning to FIG. 2 for the moment, the board under evaluation 108, also known as the evaluation board comprises the processor under test and the JTAG component known as T AP LOGIC which communicates with the JTAG probe. The Tap Logic is designed based upon the IEEE 1149.1 specification. It includes, among other things, a register and controller (ctrl.) which coats with the probe in a way set forth herein to identify the appropriate voltage level at which the JTAG interface is to operate without damage to the processor under test or related logic on the evaluation board.

Figure 1B:
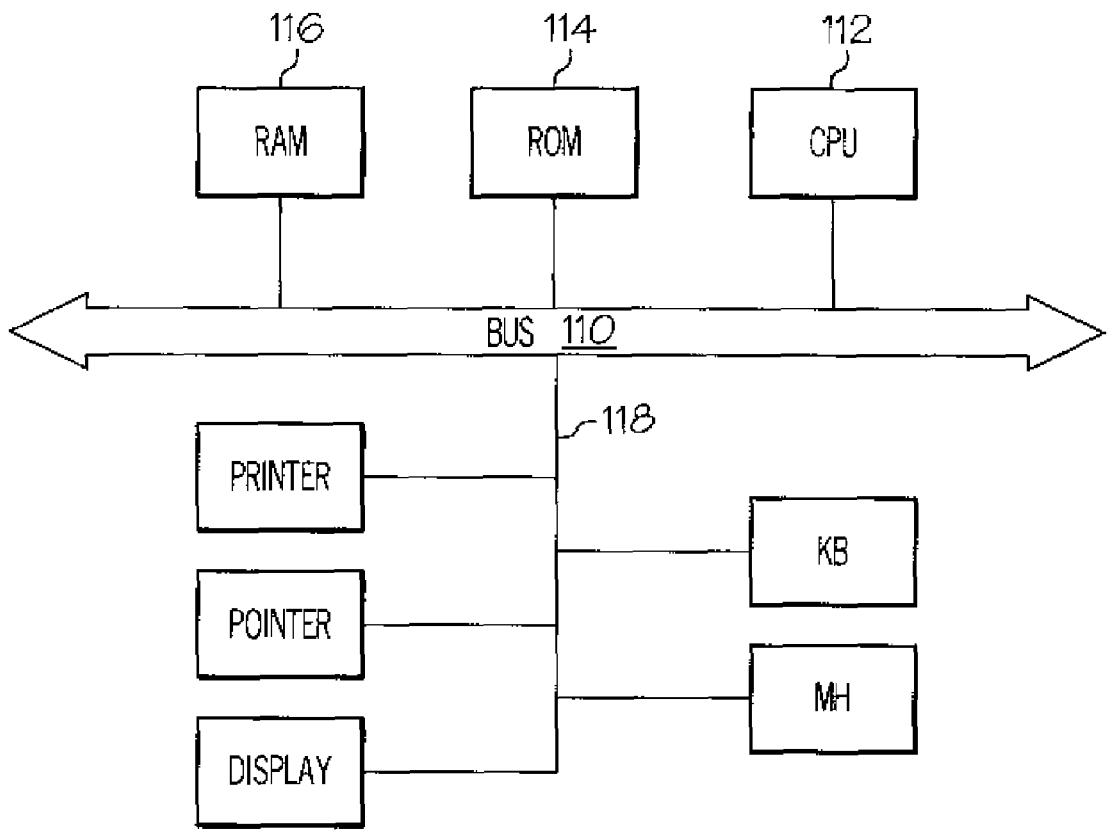
FIG. 1B illustrates a block diagram of the host system.
Figure 2:
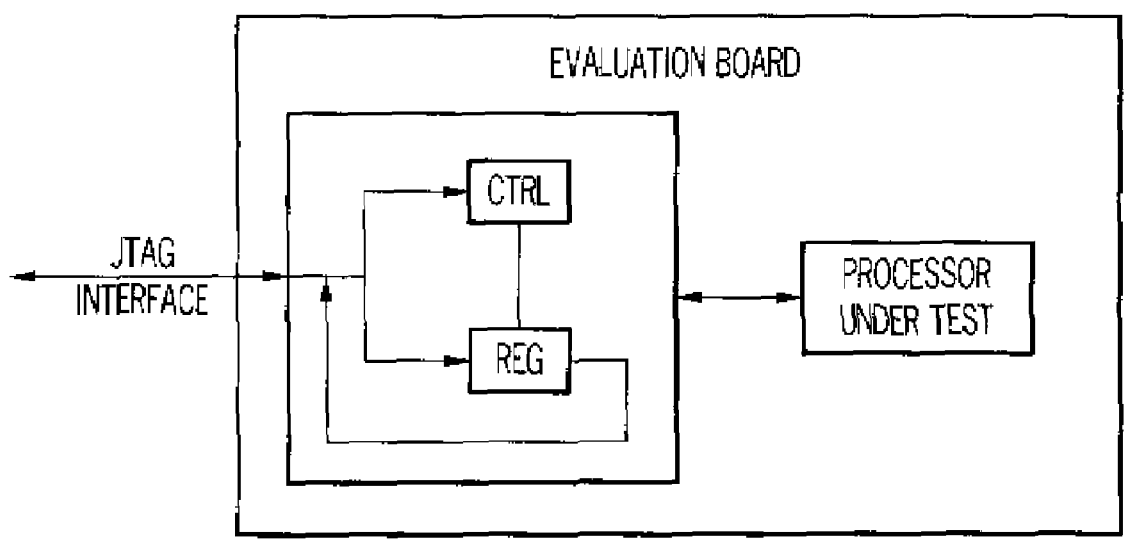
FIG. 2 illustrates an evaluation board according to teachings of the present invention.

FIG. 1B shows a block diagram for a Personal Computer (PC) which can be used to determine the proper operational voltage for the JTAG interface. The PC includes bus 110 to which CPU 112, ROM 114 and RAM 116 are coupled. The Operating system and application programs that are used by the CPU are stored in ROM 114 and/or RAM 116. I/O devices 118 including but not limited to, a printer, pointer such as a mouse, keyboard (K B), display and magnetic head (MH) reader are operatively coupled to the bus. The I/O devices are used for entering information into the PC. The display device is used for reading information that exists or is occurring in the system and the unit or processor under test. Among application programs executing on the PC is the one according to teachings of the present invention. The application program describe herein uses the JTAG probe and TAP LOGIC to determine and set the proper operational voltage for the JTAG interface.

Figure 1C:
FIG. 1C illustrates a computer readable medium.

FIG. 1C illustrates a computer readable medium on which the application program of the present invention can be recorded. It should be noted this showing is illustrative and intends to cover any type of medium past, present or future on which a computer program is written on and read from.

Figure 3:
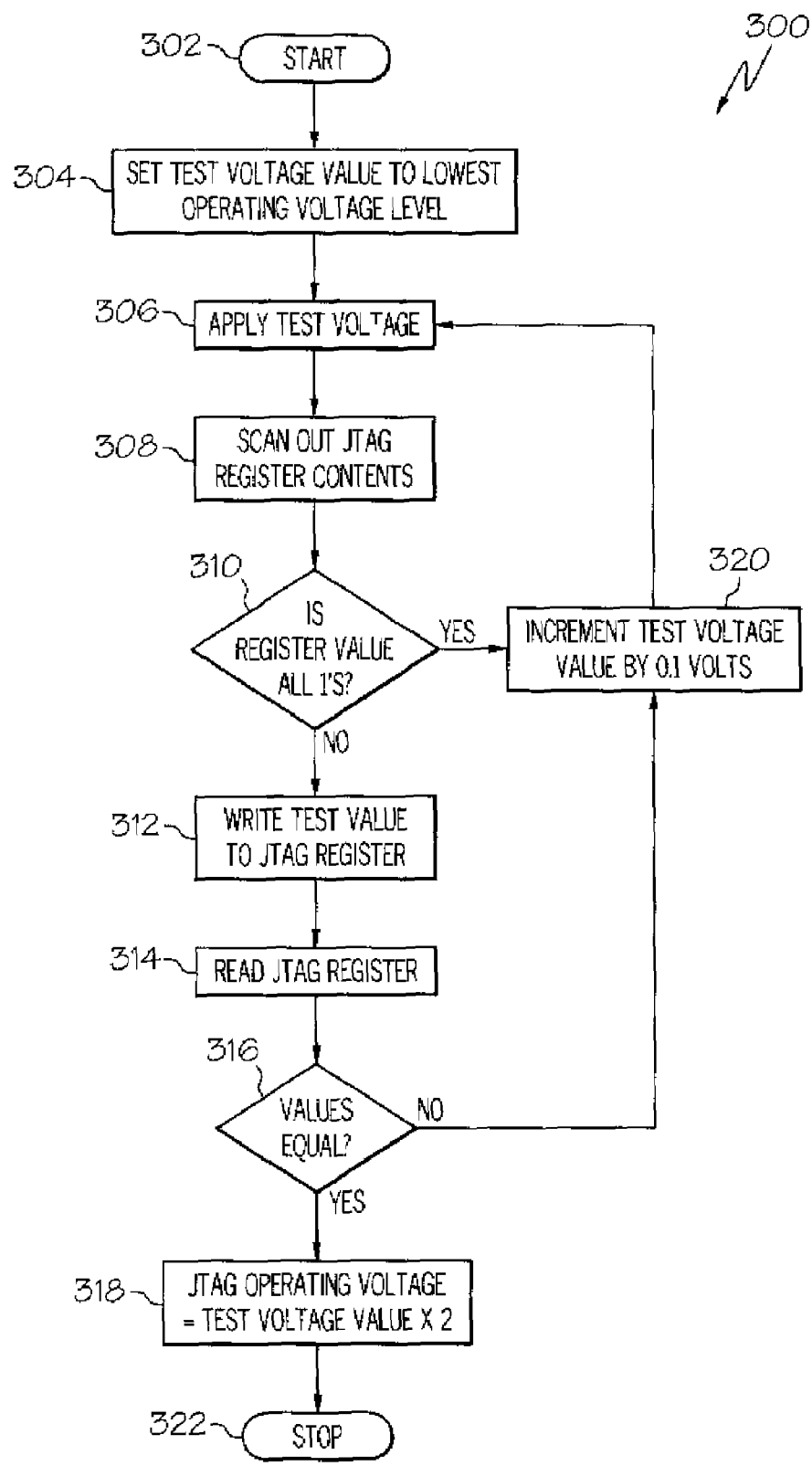
FIG. 3 shows a flowchart of the program, according to teachings of the present invention, being executed on the computing device.

FIG. 3 shows a flow chart of an application program 300 executed on the PC. The program determines and sets the operational voltage for the JTAG interface. The program includes steps 302 through 322. The program begins at step 302 and descends into step 304 whereat the program sets test voltage value to the lowest operating voltage level available at the JTAG probe. The program then descends into block 306 whereat the test voltage is applied to the JTAG interface. The program then descends into block 308 whereat a scan out of the JTAG register contents is executed. The program then descends into block 310. The program then tests if the scanned register values are all logical 1's. If the response is yes the program enters block 320 whereat the voltage is increased by an incrementally 0.1 volts and the program loops back to block 306. The previously described steps are performed until the response from block 310 is No.

Still referring to FIG. 3, if response from block 310 is No, the program the descends into block 312 where it writes a test value to the JTAG register in the TAP LOGIC. The program then descends into block 314 where it does a readout of the register that was previously written in block 312. The program than descends into block 316 wherein a test is perform to check if the value read is equal to the test value that was written in the JTAG register. If the response is no the program loops back to block 320 and perform the steps previously described onto block 316. If the response from block 316 is yes the program then descends to block 318 where the JTAG operating voltage on the JTAG interface is equal to the test voltage value times 2. The program then enters block 322 where it is terminated.

The task is to set the operational voltage of the JTAG interface at an operational value that does not damage the processor under test and/or other circuits on the evaluation board. The solution uses software to determine and set the operating voltage. In doing so I begin by setting the JTAG operating voltage at its lowest setting, which ensures that the device under test is not damaged by an over-voltage condition. I then incrementally increase the operating voltage level while accessing a specific register in the test hardware via the JTAG interface. Initially, when the JTAG interface is operated at very low voltage levels, any attempts to read and write processor registers via the JTAG interface will return all logical 0's or all 1's for all bit positions within the register regardless of what value is actually stored in the register. (i.e., There are no logic state changes at the JTAG interface.) As the voltage increases to a point where there is sufficient voltage to activate the hardware interface, the register being tested will change from all 1's to the value that is actually holds. The voltage level at which this change occurs is dependent on the switching level of the actual hardware and represents the threshold between a logical 0 and a logical 1. It is approximately one half the actual operating voltage level at which the JTAG interface should be operated. Once a known value can be written to and read back from a register, the value is above this threshold voltage level. The threshold is estimated as halfway between the two most recent values (i.e., between the highest nonworking voltage and the lowest working voltage). This threshold voltage level is then doubled to arrive at the actual voltage level for optimal robust operation of the JTAG interface.

While the present invention and its advantage have been described in detail, it should be understood that various changes, substitution and alterations can be made without departing from the spirit and scope of the present invention as defined by the following claims.

What is claimed is:

1. A method for setting an operating voltage on a circuit comprising:
   applying a voltage to said circuit;
   incrementally increasing said voltage;
   monitoring a register in said circuit to detect when contents of said register switches from a first value to a second value; and
   saving a value of said voltage occurring when switching occurred in said register.

2. The method of claim 1 further including:
   writing a pattern in said register;
   reading contents of said register; and
   setting the operating voltage as voltage saved contents read from said register matches the pattern.

3. The method of claim 2 wherein the first value includes all logical 1's.

4. The method of claim 3 wherein the second value includes all logical 0's.

5. The system of claim 4 wherein the first state includes logical 1's.

6. The method of claim 1 further includes adjusting the value saved to establish the operating voltage for said circuit.

7. The method of claim 6 wherein the adjustment includes doubling the value saved; and
   setting the interface voltage to doubled value.

8. The method of claim 1 wherein the circuit includes a JTAG interface.

9. A method comprising:
   incrementally increasing, from a first value, voltages applied to an interface circuit;
   monitoring a register in said interface circuit to detect when contents of said register switches from a first state to a second state; and
   saving a value for said voltage occurring at time of switch.

10. The method of claim 9 wherein the first value for a first voltage in a range of applied voltages includes a lowest operating voltage available to a circuit applying the range of voltages.

11. The method of claim 10 wherein the lowest operating voltage is being incremented by 0.1 volts.

12. A computer program product comprising a computer readable medium having embodied therein a computer readable program including a first code module that incrementally increases voltages applied to a circuit;
   a second code module that monitors a register in said circuit to detect a switch in contents; and
   a third code module that save a value of the voltage occurring simultaneous with the switch in contents.

13. The computer program product of claim 12 further including forth code module for setting the circuit to the saved value.

14. The computer program product of claim 13 wherein the saved value is doubled to establish an operational voltage level.

15. The system of claim 14 wherein the probe adjust the voltage in increments of 0.1 volts beginning at a first value.

16. The computer program product of claim 12 further including fifth code module that adjusts the saved value.

17. The system of claim 16 wherein accessing includes reading and writing the register.

18. A system comprising:
a register;
a circuit for accessing the register;
a device responsive to commands to incrementally adjust voltages being applied to said logic circuit; and
a computer executing a program that generates the commands, said program including instructions that generate a first command to apply a first voltage level to said logic circuit, instructions that monitors output from the register to detect a switch in contents of said register from a first state to a second state and instructions to save a voltage occurring simultaneous with switch.

19. The system of claim 18 wherein the first value includes the lowest value at which said probe operates.

20. The system of claim 18 wherein the second state includes logical 0's.

21. The system of claim 18 wherein the program further includes instructions to set the save voltage as the operating voltage to said logic circuit.

22. The system of claim 18 further including instructions that doubles the save voltage.

23. The system of claim 22 further including instructions that set interface voltage to the circuit to the value of the doubled voltage.

24. The system of claim 18 wherein the circuit is compatible with IEEE 1149.1 JTAG specification.

25. The system of claim 24 wherein the device includes a JTAG probe.

* * * * *